US008841956B2

(12) United States Patent
Ricotti et al.

(10) Patent No.: US 8,841,956 B2
(45) Date of Patent: Sep. 23, 2014

(54) HIGH VOLTAGE SWITCH CONFIGURATION

(75) Inventors: Giulio Ricotti, Broni (IT); Paolo Bompieri, Bareggio (IT); Sandro Rossi, Pavia (IT)

(73) Assignee: STMicroelectronics S.R.L., Agrate Brianza (IT)

( * ) Notice: Subject to any disclaimer, the term of this patent is extended or adjusted under 35 U.S.C. 154(b) by 218 days.

(21) Appl. No.: 13/446,882

(22) Filed: Apr. 13, 2012

(65) Prior Publication Data

US 2012/0249216 A1      Oct. 4, 2012

Related U.S. Application Data

(63) Continuation-in-part of application No. PCT/EP2010/006339, filed on Oct. 18, 2010.

(30) Foreign Application Priority Data

Oct. 16, 2009   (IT) .............................. MI2009A1784

(51) Int. Cl.
*H03K 17/687*      (2006.01)
*H03K 17/00*       (2006.01)
*H03K 17/06*       (2006.01)

(52) U.S. Cl.
CPC .................................. *H03K 17/063* (2013.01)
USPC ............................ 327/427; 327/436; 327/365

(58) Field of Classification Search
USPC ........................................ 327/427, 436, 365
See application file for complete search history.

(56) References Cited

U.S. PATENT DOCUMENTS

| 2,618,753 | A | 11/1952 | Van Mierlo |
| 3,126,488 | A | 3/1964 | Johnson |
| 5,592,031 | A | 1/1997 | Ramos Fernandez et al. |
| 7,199,640 | B2 * | 4/2007 | De Cremoux et al. ........ 327/427 |
| 7,692,473 | B2 * | 4/2010 | Ono .............................. 327/427 |
| 7,852,137 | B2 * | 12/2010 | Machida et al. .............. 327/427 |
| 8,299,842 | B2 * | 10/2012 | Sato .............................. 327/427 |

FOREIGN PATENT DOCUMENTS

FR    2612023 A1    9/1988
JP    57-15532 A    1/1982

* cited by examiner

*Primary Examiner* — Hai L Nguyen
(74) *Attorney, Agent, or Firm* — Seed IP Law Group PLLC

(57) ABSTRACT

A High Voltage switch configuration having an input terminal which receives an input signal and an output terminal which issues an output signal to a load. The High Voltage switch configuration comprises at least a first and a second diode, being placed in antiseries between said input and output terminals and having a pair of corresponding terminals in common, in correspondence of a first internal circuit node.

32 Claims, 5 Drawing Sheets

HIGH VOLTAGE SWITCH CONFIGURATION

BACKGROUND

1. Technical Field

The present disclosure relates to a High Voltage or HV switch configuration. The disclosure particularly, but not exclusively, relates to a HV switch configuration to be used in ultrasound apparatuses and the following description is made with reference to this field of application for convenience of explanation only.

2. Description of the Related Art

As is well known, a High Voltage or HV switch is usually realized by means of a high voltage MOS or DMOS transistor being able to manage high voltages between its drain and source terminals, as well as with respect to a substrate potential. The highest voltage value Vgs between its gate and source terminals is however limited to some volts (3V or 5V).

In particular, when the High Voltage switch is off it should be able to interrupt the passage of current independently from the voltage polarity at its ends. However, further to the connection of the body terminal to the source terminal, a junction is created between the source and drain terminals, which prevents the inversion of the polarity across the High Voltage switch without triggering a passage of current in the intrinsic diode thus created even if the relative channel is off.

To overcome this drawback, a High Voltage switch is realized by a configuration comprising two MOS or DMOS transistors being placed in series, so that the relative intrinsic diodes are biased in antiseries, i.e., with a pair of corresponding terminals, for example respective anodes, in common, as schematically shown in FIG. 1, the High Voltage switch configuration being indicated with 1.

The High Voltage switch configuration 1 comprises a first and a second DMOS transistor, DM1 and DM2 respectively, connected in series with the corresponding intrinsic diodes in antiseries. In this way, at least one intrinsic diode of the High Voltage switch configuration 1 is always inversely biased. The two DMOS transistors are N-channel HV transistors and have a common source terminal X1.

Moreover, a driving device or driver 2 is to be provided that is able to follow a turn on/off command of the High Voltage switch configuration 1 and to apply a first turn on voltage value (for example equal to 5V) between the gate and source terminals of the transistors contained in the High Voltage switch configuration 1 when it is to be turned on and a second turn off voltage value (for example equal to 0V) between the gate and source terminals of the transistors when the High Voltage switch configuration 1 is to be turned off.

In particular, the driver 2 is schematically represented in FIG. 1 by a generator Ge that connects respective common source X1 and gate X2 terminals of the DM1 and DM2 transistors. The DM1 and DM2 transistors also have drain terminals connected to an output terminal OUT and to an input terminal IN of the High Voltage switch configuration 1, respectively.

The driver 2 should provide to the common gate terminal X2 a suitable gate voltage for the DM1 and DM2 transistors, such a gate voltage should dynamically follow an input signal Vin applied to the input terminal IN of the High Voltage switch configuration 1 and able to correctly define the ON/OFF state of the High Voltage switch configuration 1 as above explained.

It has been observed that the High Voltage switch configuration 1 of FIG. 1 has a really good dynamic behavior.

In particular, in ultrasound apparatuses, a plurality of High Voltage switches are used, a HV trapezoidal waveform signal Vin being applied to their input terminals. Such a HV input signal Vin usually goes between −100V and +100V and have really fast up and down edges from 3000 to 10000 V/us, as shown for instance in FIG. 2.

In an example case of use in an ultrasound apparatus, the output terminal OUT of the High Voltage switch configuration 1 is connected to a piezoelectric transducer PZ as a Load, whereto the output signal Vout is applied, and the input terminal IN is connected to a generator of a pulsed input signal, indicated as HV pulser in FIG. 1 and able to provide a HV trapezoidal waveform as input signal Vin.

According to this example application in the ultrasound field, the equivalent capacitive value Cload of the piezoelectric transducer PZ is approximately equal to 15 pF and the corresponding saturation current $Id\_sat$ of the DM1 and DM2 transistors of the High Voltage switch configuration 1 is approximately equal to 35 mA.

Stating these values, the maximum slope of the output signal Vout at the output terminal OUT of the High Voltage switch configuration 1 and thus between the ends of the load, i.e., the piezoelectric transducer PZ, should be equal to:

Slope=$Id\_sat$/Cload=35 mA/15 pF=2333 v/us, as shown in FIG. 2 in a broken line.

From a theoretical point of view, during the positive half wave of the input signal Vin, the current would flow, within the High Voltage switch configuration 1, through the channel of the second transistor DM2 and the intrinsic body-drain diode of the first transistor DM1, being directly biased, according to the current path P1 shown in FIG. 3A in a broken line.

Analogously, during the negative half wave of the input signal Vin, the current is expected to flow, within the High Voltage switch configuration 1, through the channel of the first transistor DM1 and the intrinsic body-drain diode of the second transistor DM2, being directly biased, according to the current path P2 shown in FIG. 3B in a broken line.

In both cases, the current value flowing in the High Voltage switch configuration 1 would be limited by the saturation current $Id\_sat$ of one of the DM1 and DM2 transistors, i.e., to approximately 35 mA.

BRIEF SUMMARY

In an embodiment, a High Voltage switch configuration essentially comprises two diodes connected in antiseries between its input and output terminals and suitably biased for starting a junction charge and triggering the High Voltage switch configuration itself.

In an embodiment, a High Voltage switch configuration has an input terminal which receives an input signal and an output terminal which issues an output signal to a load, characterized in that it comprises at least a first and a second diode, being placed in antiseries between said input and output terminals and having a pair of corresponding terminals in common, in correspondence of a first internal circuit node.

The High Voltage switch configuration further comprises a triggering circuit coupled to said first internal circuit node and providing a triggering to said High Voltage switch configuration in order to store charges in said first and second diodes and start a conduction path through said first and second diodes before applying said input signal to said input terminal of said High Voltage switch configuration.

In an embodiment, said triggering circuit is inserted between a voltage supply reference and said first internal circuit node and has a triggering terminal receiving a starting signal, being an ON/OFF short pulse.

In an embodiment, said triggering circuit comprises a series of a DMOS transistor, a third diode and a resistor, inserted in series to each other between said voltage supply reference and said first internal circuit node, said DMOS transistor also having a control terminal coupled to said triggering terminal.

Furthermore, according to an embodiment, said DMOS transistor has an intrinsic body-source diode being in antiseries with said third diode and having a pair of corresponding terminals in common.

In an embodiment, said DMOS transistor is a P-channel High Voltage transistor.

According to an embodiment, said starting signal provides said DMOS transistor with a short pulse, which, through said resistor, forces a triggering current in said second diode, switching said High Voltage switch configuration on.

Moreover, said starting signal provides the junction charges of said first and second diodes in an amount sufficient to switching said diodes on before applying said input signal to said input terminal to trigger said High Voltage switch configuration.

According to an embodiment, said voltage supply reference is a low voltage supply reference.

Moreover, according to an embodiment, said output terminal is coupled to a piezoelectric transducer as a load and said input terminal is coupled to a generator of a pulsed input signal, in particular a HV trapezoidal waveform.

According to an embodiment, said first and second diodes have the anodes in common.

According to an embodiment, said intrinsic body-source diode of said DMOS transistor and said third diode have the anodes in common.

In an embodiment, a high voltage switch comprises: an input configured to receive an input signal to drive a load; an output configured to provide an output signal to the load; at least a first and a second diode, configured in antiseries between said input and output; a common node of the at least first and second diodes configured to receive a triggering signal to cause the first and second diodes to form a conductive path between the input and the output of the switch; and a triggering block coupled to said common node and configured to provide the triggering signal to said common node to store charges in said first and second diodes and start the conduction path through said first and second diodes. In an embodiment, said triggering block is coupled between a voltage supply reference and said common node and has a control input configured to receive a starting signal, the starting signal being an ON/OFF short pulse. In an embodiment, said triggering block comprises a DMOS transistor, a third diode and a resistor, coupled in series between said voltage supply reference and said common node, said DMOS transistor also having a control coupling coupled to said control input. In an embodiment, said DMOS transistor has an intrinsic body-source diode being in antiseries with said third diode. In an embodiment, said DMOS transistor is a P-channel high voltage transistor. In an embodiment, said starting signal provides said DMOS transistor with a short pulse, which, through said resistor, forces a triggering current in said second diode, switching said high voltage switch on. In an embodiment, said starting signal provides junction charges of said first and second diodes in an amount sufficient to switching said diodes on before said input signal is applied to said input to trigger said high voltage switch. In an embodiment, said voltage supply reference is a low voltage supply reference. In an embodiment, said output is configured to couple to a piezoelectric transducer as the load and said input is configured to couple to a generator of a pulsed HV trapezoidal waveform. In an embodiment, said first and second diodes have anodes coupled together. In an embodiment, said intrinsic body-source diode of said DMOS transistor and said third diode have anodes coupled together.

In an embodiment, a system comprises: a switch including: a first diode configured to couple to an output; a second diode coupled in antiseries with the first diode and configured to couple to an input; and a common node of the first and second diodes configured to receive a triggering signal; and a triggering block coupled to the common node and configured to selectively generate the triggering signal, wherein the switch is configured to form a conductive path between the input and the output through the first and second diodes in response to the triggering signal. In an embodiment, the triggering block is coupled between a voltage supply reference and the common node and configured to receive a control signal and to selectively generate the triggering signal based on the control signal. In an embodiment, the triggering block comprises a DMOS transistor, a third diode and a resistor, coupled in series between the voltage supply reference and the common node, said DMOS transistor comprising a control coupling configured to receive the control signal. In an embodiment, the DMOS transistor comprises an intrinsic body-source diode coupled in antiseries with the third diode. In an embodiment, the DMOS transistor is a P-channel high voltage transistor. In an embodiment, the control signal is a pulse signal. In an embodiment, the triggering block is configured to respond to the pulse signal by forcing a triggering current in the second diode. In an embodiment, the system further comprises: a piezoelectric transducer coupled to the output of the switch; and a generator coupled to the input of the switch and configured to generate a pulsed HV trapezoidal waveform. In an embodiment, the system further comprises: a load controller coupled to the triggering block and configured to generate the control signal. In an embodiment, the first and second diodes comprise first and second transistors in a diode configuration.

In an embodiment, a method comprises: coupling first and second diodes together in anti-series between a high-voltage signal source and a load; generating a triggering signal in a triggering block; and applying the triggering signal to a common node of the first and second diodes, the triggering signal creating an overvoltage condition of one of the first and second diodes to form a conductive path through the first and second diodes and between the high-voltage signal source and the load. In an embodiment, the method comprises coupling the triggering block between a voltage supply reference and the common node. In an embodiment, the method further comprises receiving a control signal wherein the generating the triggering signal comprises generating the triggering signal based on the control signal. In an embodiment, the triggering block comprises a DMOS transistor, a third diode and a resistor, coupled in series between the voltage supply reference and the common node, said DMOS transistor comprising a control coupling configured to receive the control signal. In an embodiment, the method further comprises generating the control signal. In an embodiment, generating the control signal comprises generating a pulse signal.

In an embodiment, a system comprises: means for generating a high-voltage signal; means for receiving the high-voltage signal; and means for selectively creating a conductive path through first and second diodes coupled together in anti-series between the means for generating and the means for receiving. In an embodiment, the means for generating comprises a high-voltage pulse generator. In an embodiment, the means for receiving comprises a piezoelectric transducer. In an embodiment, the means for selectively creating comprises a triggering block. In an embodiment, the system further comprises means for generating a control signal to control the means for selectively creating.

The characteristics and advantages of various embodiments of the High Voltage switch configuration according to the disclosure will be apparent from the following description of example embodiments thereof given by way of indicative and non limiting example with reference to the annexed drawings.

DETAILED DESCRIPTION

In the following description, numerous specific details are given to provide a thorough understanding of embodiments. The embodiments can be practiced without one or more of the specific details, or with other methods, components, materials, etc. In other instances, well-known structures, materials, or operations, such as, for example, details of transistors and diodes, are not shown or described in detail to avoid obscuring aspects of the embodiments.

Reference throughout this specification to "one embodiment" or "an embodiment" means that a particular feature, structure, or characteristic described in connection with the embodiment is included in at least one embodiment. Thus, the appearances of the phrases "in one embodiment" "according to an embodiment" or "in an embodiment" and similar phrases in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
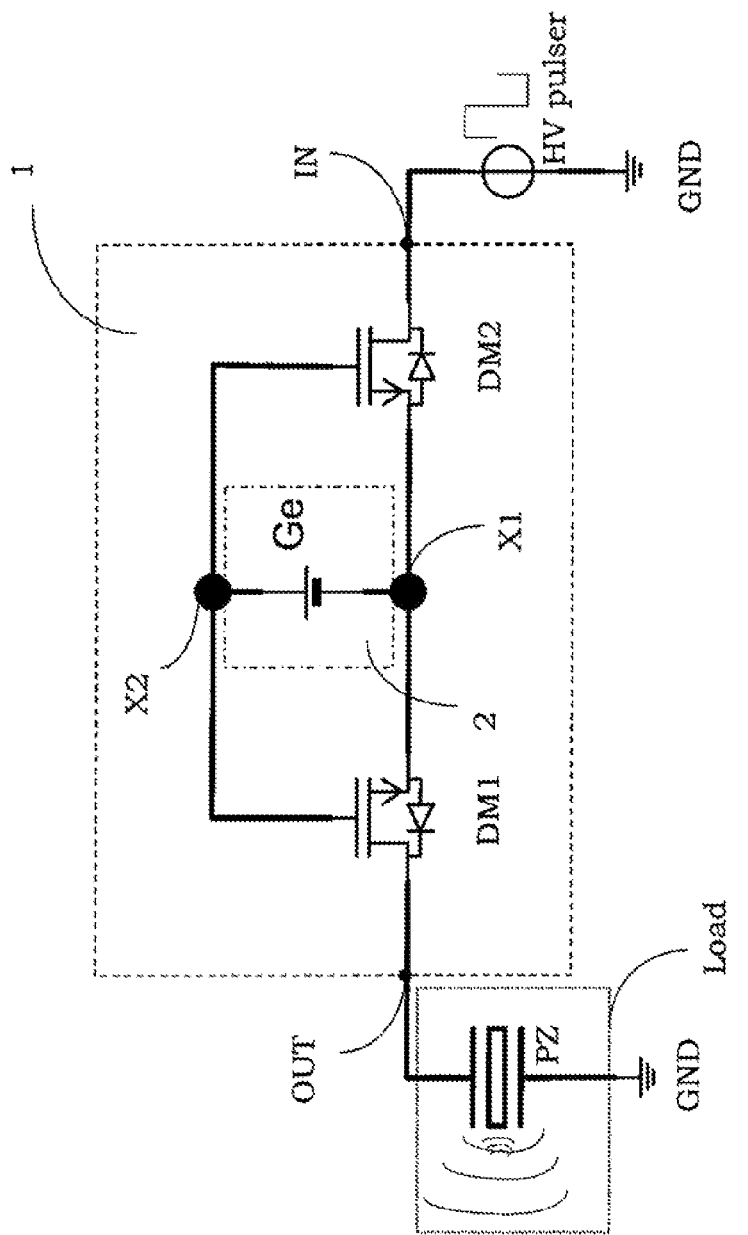
FIG. 1 schematically shows a High Voltage switch configuration realized according to prior art.
Figure 2:
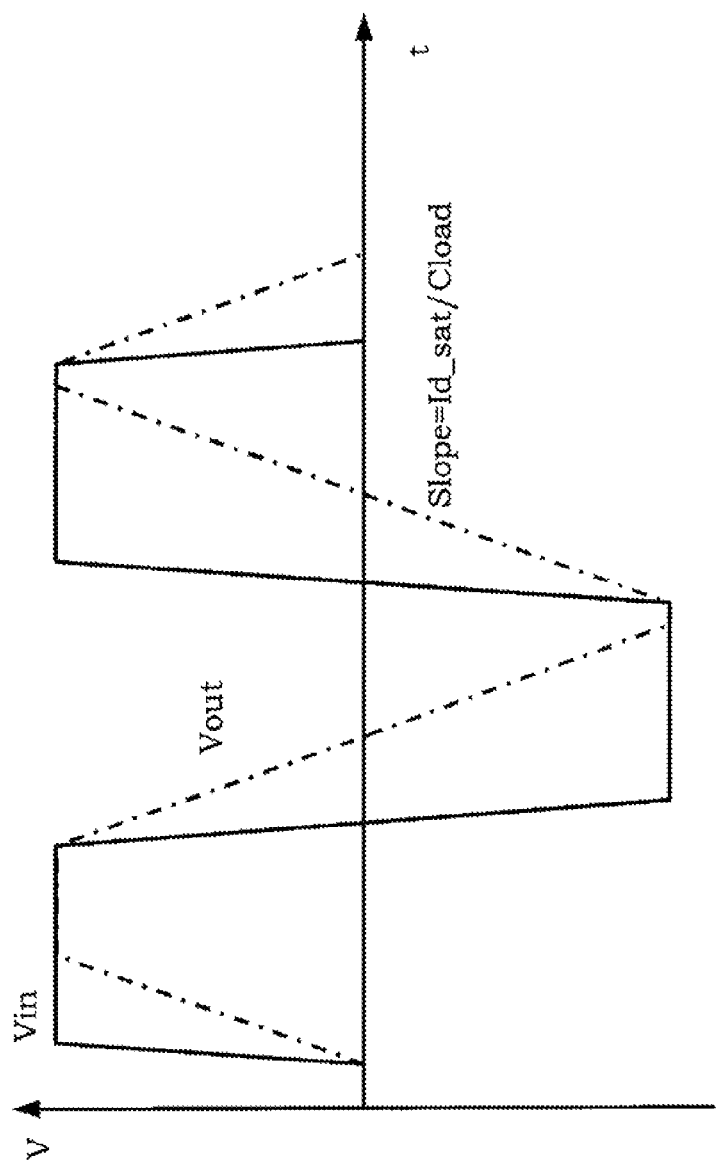
FIG. 2 schematically shows the theoretical results of the behavior of the High Voltage switch configuration of FIG. 1.
Figure 4:
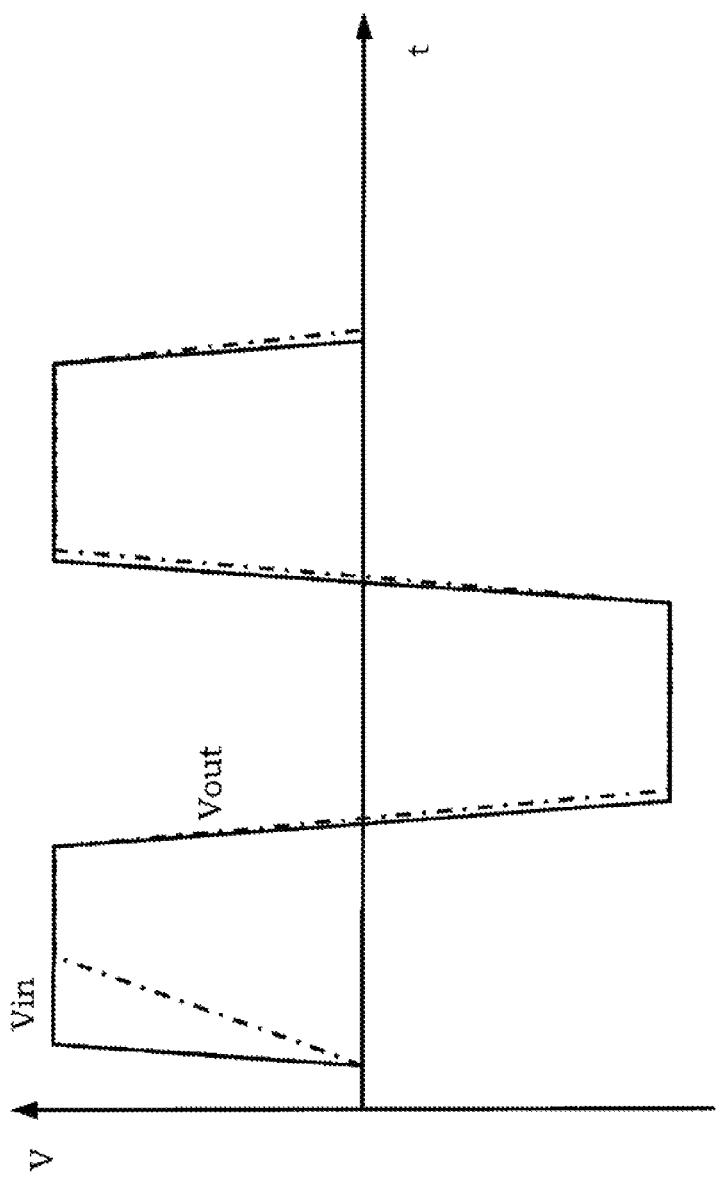
FIG. 4 schematically shows the results of a simulation carried out on the High Voltage switch configuration of FIG. 1.

The present disclosure starts from the observation that the output signal Vout of the known High Voltage switch configuration 1 of FIG. 1, as applied to a piezoelectric load PZ, is actually sharper than the theoretical one, as verified by a simulation of the High Voltage switch configuration 1, the results of such a simulation being shown in FIG. 4, the output signal Vout being indicated in a broken line.

In other words, the output signal Vout follows the input one Vin in an unexpected and very suitable form, also in case the input signal Vin has very fast transitions, in particular equal to 10000V/us, as in the case of ultrasound apparatuses.

This should mean that the real current Ireal flowing within the known High Voltage switch configuration 1 is higher than the saturation current Id_sat of the DM1 and DM2 transistors, and in particular equal to:

$$Ireal=10000V/us*15\ pF=150\ mA$$

Figure 3A:
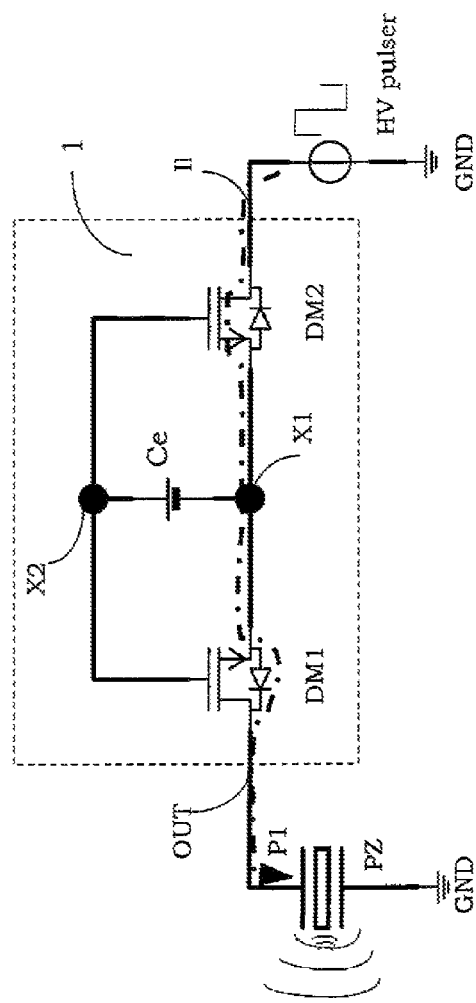
FIGS. 3A and 3B schematically show current paths within the High Voltage switch configuration of FIG. 1 according to its theoretical behavior.

Moreover, a close observation of the output signal Vout shows that during the first raising edge of the input signal Vin the output signal Vout actually has a slope corresponding to the theoretical one, i.e., equal to Id_sat/Cload. This means that the current path P1 shown in FIG. 3A is the correct one and the output signal Vout is consequently limited by the saturation current Id_sat of the second transistor DM2.

Figure 3B:
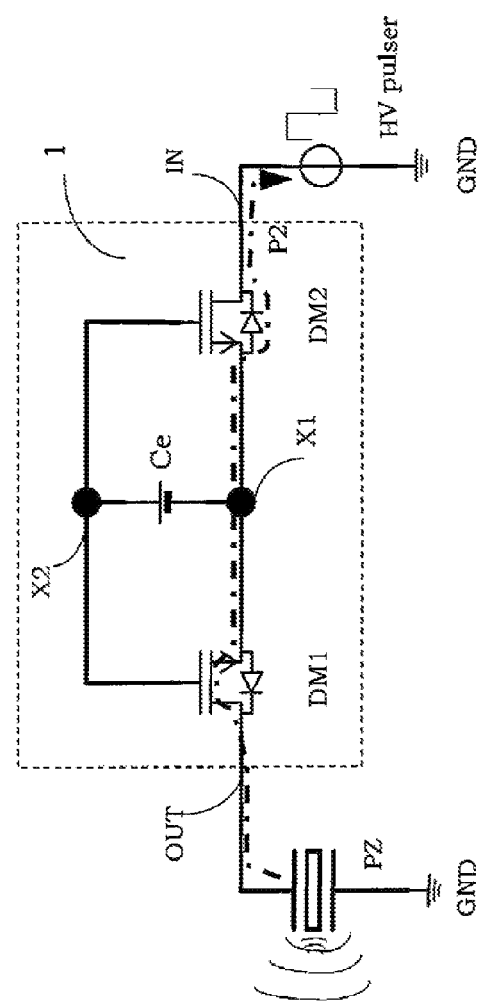

However, such an output signal Vout during the subsequent falling edge of the input signal Vin is not limited by the saturation current Id_sat of the first transistor DM1 and thus it does not follow the current path P2 of FIG. 3B.

Advantageously, it has been thus deduced that during the falling edge of the input signal Vin the current within the High Voltage switch configuration 1 actually flows through the intrinsic body-drain diode of the first transistor DM1. In fact, it can be derived that, during the preceding raising edge of the input signal Vin, such an intrinsic body-drain diode of the first transistor DM1 has stored a certain amount of junction charges having been directly or forward biased. In this way, during the subsequent falling edge of the input signal Vin the intrinsic body-drain diode of the first transistor DM1, bypassing the channel of the first transistor DM1, releases such stored channel charges according to a recovery charge mechanism.

The same situation reappears during the subsequent raising edge of the input signal Vin for the intrinsic body-drain diode of the second transistor DM2, which has been forward biased during the preceding falling edge and it has thus stored junction charges in an analogous way.

Advantageously, it has been also considered that if the frequency of the input signal Vin is sufficiently high, and in particular such that the recovery time of the intrinsic diodes of the DM1 and DM2 transistors is higher than the semi-period of such an input signal Vin, started the alternative current path through the intrinsic diodes previously charged (i.e., following the first raising edge of such an input signal Vin), such alternative current path is stable in time, until an input signal Vin is applied to the input terminal IN of the High Voltage switch configuration 1.

Figure 5:
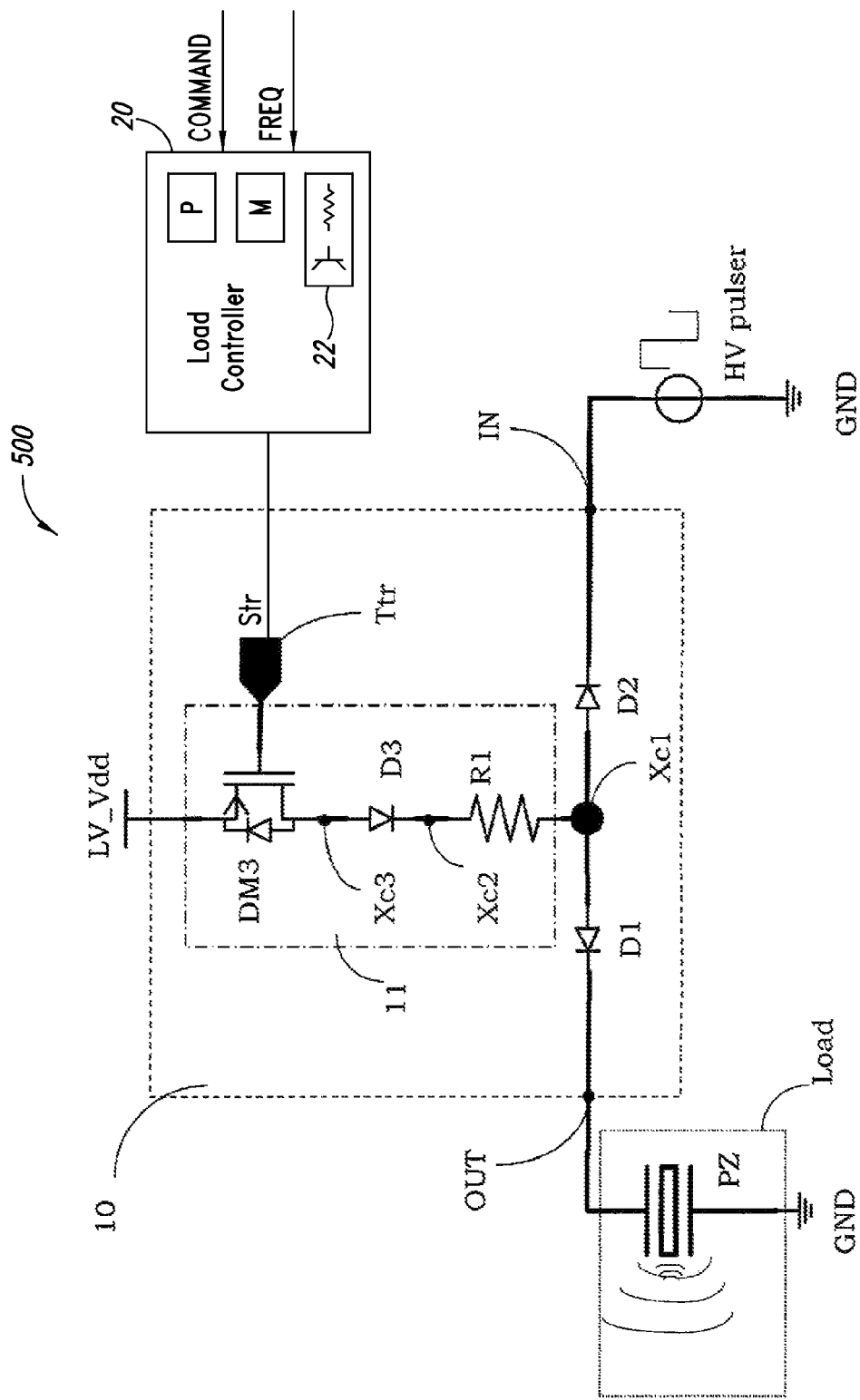
FIG. 5 schematically shows a High Voltage switch configuration according to an embodiment.

Starting from the above observations and deductions, a High Voltage switch configuration has been devised, as shown in an embodiment in FIG. 5, schematically indicated with 10.

The High Voltage switch configuration 10 essentially comprises a first and a second diode, D1 and D2 respectively, being placed in antiseries between an input and an output coupling IN and OUT respectively, of the High Voltage switch configuration 10 and having a pair of corresponding connections, in particular respective anodes, in common, in correspondence of a first internal circuit node Xc1. The input coupling IN receives an input signal Vin and the output coupling OUT issues an output signal Vout.

As shown in FIG. 5, a system 500, which may be, for example, an ultrasound apparatus, employs a High Voltage switch configuration 10, the output coupling OUT being coupled to a piezoelectric transducer PZ as a Load, whereto the output signal Vout is applied, and the input coupling IN being coupled to a generator of a pulsed input signal, indicated as HV pulser and able to provide the input signal Vin, in particular a HV trapezoidal waveform.

The High Voltage switch configuration 10 further comprises a triggering block 11 coupled to the first internal circuit node Xc1 and configured to provide a triggering to the High Voltage switch configuration 10, for example, allowing suitable channel charges to be stored in the diodes D1 and D2 in order to start a conduction path through them before applying an input signal Vin to the input terminal IN of the High Voltage switch configuration 10.

The triggering block 11 is coupled between a voltage supply reference, for example, a low voltage supply reference LV_Vdd, and the first internal circuit node Xc1 and has a triggering terminal or node Ttr receiving a starting signal Str, being an ON/OFF short pulse.

The triggering block 11 also comprises a series of a DMOS transistor DM3, a third diode D3 and a resistor R1, inserted in series to each other between the low voltage supply reference LV_Vdd and the first internal circuit node Xc1, the diode D3 and the resistor R1 being interconnected in correspondence with a second internal circuit node Xc2 and the third diode D3 and the DMOS transistor DM3 being interconnected in correspondence with a third internal circuit node Xc3.

The DMOS transistor DM3 also has a control or gate coupled to the triggering terminal Ttr of the triggering circuit or block 11 and receiving therefrom the starting signal Str. As illustrated, the DMOS transistor DM3 is a P-channel High Voltage transistor and has an intrinsic body-source diode being in antiseries with the third diode D3, i.e., the intrinsic body-source diode of the DMOS transistor DM3 and the third diode D3 have a pair of corresponding nodes or terminals, in particular respective anodes, in common.

The starting signal Str provides the DMOS transistor DM3 with a short pulse, which, through the resistor R1, forces a triggering current in the second diode D2 which is thus closed with the triggering block 11. In this way, the starting signal Str switches the High Voltage switch configuration 10 on. In response to the starting signal Str, the triggering block 11 is configured to provide a sufficient amount of junction charges for the first and second diodes, D1 and D2, i.e., an amount switching the diodes on, before applying the input signal Vin to the input terminal IN in order to trigger the High Voltage switch configuration 10. For example, this signal Str may be provided for few microseconds.

On the contrary, by applying no starting signal Str to the triggering terminal Ttr, the High Voltage switch configuration 10 is kept off.

The system 500 comprises a load controller 20, which as illustrated comprises a processor P, a memory M and discrete circuitry 22. Embodiments of the load controller 20 may comprise various combinations of discrete circuitry, processors and memory. For example, an embodiment of the load controller 20 may have only discrete circuitry. The load controller 20 is configured to generate the signal Str applied to the triggering block 11 of the high voltage switch 10. As illustrated, the load controller 20 is configured to receive a command signal COMMAND and to generate the starting signal Str based on the received signal. Embodiments of the load controller 20 may be configured to generate the command signal, instead of receiving it. Other signals may be received by the load controller 20, such as the illustrated frequency signal FREQ, and used by the load controller 20 to generate the starting signal Str.

The High Voltage switch configuration 10 realizes a switch being suitable to be used in application using HV input signal Vin having really fast up and down edges, as is the case of the ultrasound apparatuses.

In essence, a High Voltage floating switch configuration has been provided in the sense that it is not latched to the voltage references Vdd and/or GND, depending only to the processed signal, i.e., the input signal Vin.

The High Voltage switch configuration 10 has a really simple and thus highly reliable architecture and provides for an output signal able to follow an input signal in a very suitable form, also in case of very fast transitions.

In particular, the diodes D1 and D2 are able to store the state (ON/OFF) of the High Voltage switch configuration 10 thanks to the charge storing mechanism as above described. Such a stored charge also guarantees that the on state of the High Voltage switch configuration 10 is duly maintained.

Some embodiments may take the form of computer program products. For example, according to one embodiment there is provided a computer readable medium comprising a computer program adapted to perform one or more of the methods described above. The medium may be a non-transitory medium such as for example a Read Only Memory (ROM) chip, or a disk such as a Digital Versatile Disk (DVD-ROM), Compact Disk (CD-ROM), a hard disk, a memory, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the systems and/or modules may be implemented or provided in other manners, such as at least partially in firmware and/or hardware, including, but not limited to, one or more application-specific integrated circuits (ASICs), discrete circuitry, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology. In some embodiments, some of the modules or controllers separately described herein may be combined, split into further modules and/or split and recombined in various manners.

The systems, modules and data structures may also be transmitted as generated data signals (e.g., as part of a carrier wave) on a variety of computer-readable transmission mediums, including wireless-based and wired/cable-based mediums.

Obviously, a technician of the field, aiming at meeting incidental and specific needs, will bring several modifications to the above described configuration, all within the scope of this disclosure.

The various embodiments described above can be combined to provide further embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A high voltage switch, comprising:
an input configured to receive an input signal;
an output configured to provide an output signal;
at least a first and a second diode, configured in antiseries between said input and output;
a common node of the at least first and second diodes configured to receive a triggering signal to cause the first and second diodes to form a conduction path between the input and the output of the switch; and
a triggering block coupled to said common node and configured to provide the triggering signal to said common node to store charges in said first and second diodes and start the conduction path through said first and second diodes.

2. The high voltage switch according to claim 1 wherein said triggering block is coupled between a voltage supply reference and said common node and has a control input configured to receive a starting signal, the starting signal being an ON/OFF short pulse.

3. The high voltage switch according to claim 2 wherein said voltage supply reference is a low voltage supply reference.

4. The high voltage switch according to claim 2 wherein said triggering block comprises a DMOS transistor, a third diode and a resistor, coupled in series between said voltage supply reference and said common node, said DMOS transistor also having a control coupling coupled to said control input.

5. The high voltage switch according to claim 4 wherein said starting signal provides said DMOS transistor with a short pulse, which, through said resistor, forces a triggering current in said second diode, switching said high voltage switch on.

6. The high voltage switch according to claim 5 wherein said starting signal provides junction charges of said first and second diodes in an amount sufficient to switching said diodes on before said input signal is applied to said input to trigger said high voltage switch.

7. The high voltage switch according to claim 4 wherein said DMOS transistor has an intrinsic body-source diode being in antiseries with said third diode.

8. The high voltage switch according to claim 7 wherein said DMOS transistor is a P-channel high voltage transistor.

9. The high voltage switch according to claim 7 wherein said intrinsic body-source diode of said DMOS transistor and said third diode have anodes coupled together.

10. The high voltage switch according to claim 1 wherein said first and second diodes have anodes coupled together.

11. The high voltage switch according to claim 1 wherein said output is configured to couple to a piezoelectric transducer as a load and said input is configured to couple to a generator of a pulsed HV trapezoidal waveform.

12. A system, comprising:
a switch including:
a first diode configured to couple to an output;
a second diode coupled in antiseries with the first diode and configured to couple to an input; and
a common node of the first and second diodes configured to receive a triggering signal; and
a triggering block coupled to the common node and configured to selectively generate the triggering signal, wherein the switch is configured to form a conductive path between the input and the output through the first and second diodes in response to the triggering signal.

13. The system of claim 12 wherein the triggering block is coupled between a voltage supply reference and the common node and configured to receive a control signal and to selectively generate the triggering signal based on the control signal.

14. The system of claim 13 wherein the control signal is a pulse signal.

15. The system of claim 14 wherein the triggering block is configured to respond to the pulse signal by forcing a triggering current in the second diode.

16. The system of claim 13 wherein the triggering block comprises a DMOS transistor, a third diode and a resistor, coupled in series between the voltage supply reference and the common node, said DMOS transistor comprising a control coupling configured to receive the control signal.

17. The system of claim 16 wherein the DMOS transistor comprises an intrinsic body-source diode coupled in antiseries with the third diode.

18. The system of claim 16 wherein the DMOS transistor is a P-channel high voltage transistor.

19. The system of claim 16, further comprising:
a piezoelectric transducer coupled to the output of the switch; and
a generator coupled to the input of the switch and configured to generate a pulsed HV trapezoidal waveform.

20. The system of claim 16, further comprising:
a load controller coupled to the triggering block and configured to generate the control signal.

21. The system of claim 12 wherein the first and second diodes comprise first and second transistors in a diode configuration.

22. A method, comprising:
coupling first and second diodes together in anti-series between a high-voltage signal source and a load;
generating a triggering signal in a triggering block; and
applying the triggering signal to a common node of the first and second diodes, the triggering signal creating an overvoltage condition of one of the first and second diodes to form a conductive path through the first and second diodes and between the high-voltage signal source and the load.

23. The method of claim 22 comprising coupling the triggering block between a voltage supply reference and the common node.

24. The method of claim 23, further comprising receiving a control signal wherein the generating the triggering signal comprises generating the triggering signal based on the control signal.

25. The method of claim 24 wherein the triggering block comprises a DMOS transistor, a third diode and a resistor, coupled in series between the voltage supply reference and the common node, said DMOS transistor comprising a control coupling configured to receive the control signal.

26. The method of claim 24, further comprising generating the control signal.

27. The method of claim 26 wherein generating the control signal comprises generating a pulse signal.

28. A system, comprising:
means for generating a high-voltage signal;
means for receiving the high-voltage signal; and
means for selectively creating a conductive path through first and second diodes coupled together in anti-series between the means for generating and the means for receiving.

29. The system of claim 28 wherein the means for generating comprises a high-voltage pulse generator.

30. The system of claim 28 wherein the means for receiving comprises a piezoelectric transducer.

31. The system of claim 28 wherein the means for selectively creating comprises a triggering block.

32. The system of claim 28, further comprising means for generating a control signal to control the means for selectively creating.

* * * * *